United States Patent
Riedel et al.

(10) Patent No.: US 10,312,460 B2
(45) Date of Patent: Jun. 4, 2019

(54) OPTOELECTRONIC DEVICE, ARRANGEMENT HAVING AN OPTOELECTRONIC DEVICE AND METHOD OF PRODUCING AN OPTOELECTRONIC DEVICE AS WELL AS LAMP FOR A MOTOR VEHICLE

(71) Applicant: OSRAM OLED GmbH, Regensburg (DE)

(72) Inventors: Daniel Riedel, Regensburg (DE); Nina Riegel, Tegernheim (DE); Thomas Wehlus, Lappersdorf (DE); Arne Fleißner, Regensburg (DE); Armin Heinrichsdobler, Bad Abbach (DE); Sebastian Wittmann, Regensburg (DE)

(73) Assignee: OSRAM OLED GmbH (DE)

( * ) Notice: Subject to any disclaimer, the term of this patent is extended or adjusted under 35 U.S.C. 154(b) by 0 days.

(21) Appl. No.: 15/618,233

(22) Filed: Jun. 9, 2017

(65) Prior Publication Data

US 2018/0006249 A1     Jan. 4, 2018

(30) Foreign Application Priority Data

Jun. 13, 2016   (DE) .................. 10 2016 110 782

(51) Int. Cl.
| | |
|---|---|
| *H01L 51/00* | (2006.01) |
| *B60R 1/12* | (2006.01) |
| *H01L 27/32* | (2006.01) |
| *H01L 51/52* | (2006.01) |
| *H01L 51/56* | (2006.01) |

(52) U.S. Cl.
CPC ........ *H01L 51/0096* (2013.01); *B60R 1/1207* (2013.01); *H01L 27/3209* (2013.01); *H01L 27/3225* (2013.01); *H01L 51/0097* (2013.01); *H01L 51/5268* (2013.01); *H01L 51/56* (2013.01); *H01L 2251/5338* (2013.01); *H01L 2251/5361* (2013.01); *Y02E 10/549* (2013.01)

(58) Field of Classification Search
CPC ............ H01L 51/0096; H01L 51/0097; H01L 51/5268; H01L 51/56; H01L 51/00; H01L 51/50; H01L 51/525; H01L 51/5287; H01L 51/5209
USPC .......................................................... 257/79
See application file for complete search history.

(56) References Cited

U.S. PATENT DOCUMENTS

| | | |
|---|---|---|
| 2003/0169160 A1 | 9/2003 | Rodriguez Barros et al. |
| 2007/0279923 A1* | 12/2007 | Rodriguez Barros ....................... B60Q 1/2665 362/494 |
| 2017/0068275 A1* | 3/2017 | Lee ....................... G06F 1/1652 |

FOREIGN PATENT DOCUMENTS

| | | |
|---|---|---|
| DE | 601 19 122 T2 | 12/2006 |
| DE | 10 2006 060 781 A1 | 4/2008 |

* cited by examiner

*Primary Examiner* — Chuong A Luu
(74) *Attorney, Agent, or Firm* — DLA Piper LLP (US)

(57) ABSTRACT

An optoelectronic device includes a flexible organic light-emitting diode having a main extension plane, a first retaining element having a first major surface formed in accordance with a bent surface, and a second retaining element, wherein the OLED is arranged between the first retaining element and the second retaining element, and the OLED is mechanically fixed by the first retaining element and/or the second retaining element such that the main extension plane of the OLED is formed in accordance with the bent surface.

21 Claims, 5 Drawing Sheets

OPTOELECTRONIC DEVICE, ARRANGEMENT HAVING AN OPTOELECTRONIC DEVICE AND METHOD OF PRODUCING AN OPTOELECTRONIC DEVICE AS WELL AS LAMP FOR A MOTOR VEHICLE

TECHNICAL FIELD

This disclosure relates to an optoelectronic device, an arrangement having an optoelectronic device, a method of producing an optoelectronic device and a lamp for a motor vehicle.

BACKGROUND

There is a need to provide an optoelectronic device having a flexible organic light-emitting diode (OLED) which is fixed in a bent surface, wherein damage to the component is reduced, an arrangement having such an optoelectronic device as well as a method of producing such an optoelectronic device and a lamp for a motor vehicle.

SUMMARY

We provide an optoelectronic device including a flexible organic light-emitting diode having a main extension plane, a first retaining element having a first major surface formed in accordance with a bent surface, and a second retaining element, wherein the OLED is arranged between the first retaining element and the second retaining element, and the OLED is mechanically fixed by the first retaining element and/or the second retaining element such that the main extension plane of the OLED is formed in accordance with the bent surface.

We also provide an arrangement including at least one optoelectronic device including a flexible organic light-emitting diode having a main extension plane, a first retaining element having a first major surface formed in accordance with a bent surface, and a second retaining element, wherein the OLED is arranged between the first retaining element and the second retaining element, and the OLED is mechanically fixed by the first retaining element and/or the second retaining element such that the main extension plane of the OLED is formed in accordance with the bent surface, and a holder in which the optoelectronic device is fastened.

We further provide a method of producing an optoelectronic device, including providing a flexible OLED having a main extension plane, providing a first retaining element having a first major surface formed in accordance with a bent surface, and fixing the OLED between the first retaining element and a second retaining element such that the main extension plane of the OLED is formed in accordance with the bent surface.

We yet further provide a lamp for a motor vehicle including the optoelectronic device including a flexible organic light-emitting diode having a main extension plane, a first retaining element having a first major surface formed in accordance with a bent surface, and a second retaining element, wherein the OLED is arranged between the first retaining element and the second retaining element, and the OLED is mechanically fixed by the first retaining element and/or the second retaining element such that the main extension plane of the OLED is formed in accordance with the bent surface.

FIGS. (3, 6, 9 and) 10 to 12 each show a schematic illustration of a finished optoelectronic device according to one example.

Figure 13:
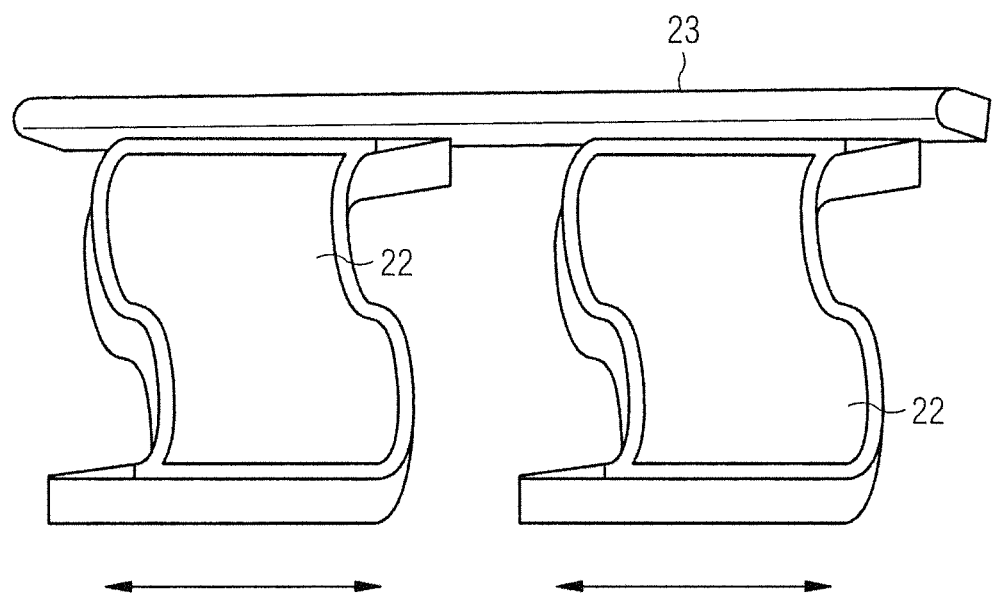

FIG. 13 shows a schematic illustration of an arrangement having two optoelectronic devices according to one example.

LIST OF REFERENCE NUMERALS

1 Flexible OLED
2 Substrate
3 Organic layer stack
4 Active layer
5 First electrode
6 Second electrode
7 Encapsulation layer
8 First electrical contact
9 Second electrical contact
10 First retaining element
11 Second retaining element
12 Bent surface
13 Connecting element
14 Main extension plane
15 Transparent casting compound
16 Cavity
17 Mold half
18 Logo
19 Scattering particles
20 Recess
21 Third retaining element
22 Optoelectronic device
23 Holder

DETAILED DESCRIPTION

We provide an optoelectronic device including a flexible OLED.

An OLED generally comprises a substrate and two electrodes. A functional organic layer stack having an active layer is arranged between the two electrodes, the active layer generating electromagnetic radiation during operation of the OLED. One electrode is arranged on the substrate and the other electrode is arranged on the organic layer stack. The two electrodes supply the organic layer stack with power during operation. The organic layer stack includes an organic material. Preferably, the organic layer stack is formed from an organic material. The organic layer stack is generally transparent at least for light generated in the active layer. Furthermore, the organic layer stack is generally flexible.

The term "transparent" means in particular that 85%, preferably 90%, and particularly preferably 95%, of the respective mentioned electromagnetic radiation such as, e.g., visible light is transmitted from the element referred to as being "transparent".

The first electrode and/or the second electrode can e.g. contain or consist of a transparent conductive oxide. Such an electrode is generally permeable or transparent for visible light, in particular for light generated in the active layer.

Transparent conductive oxides (TCO) are generally metal oxides such as, for example, zinc oxide, tin oxide, cadmium oxide, titanium oxide, indium oxide or indium-tin oxide (ITO). In addition to binary metal-oxygen compounds such as, e.g., ZnO, $SnO_2$ or $In_2O_3$, ternary metal-oxygen compounds such as, e.g., $Zn_2SnO_4$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and may furthermore also be p- and n-doped.

Furthermore, it is also possible for the first electrode and/or the second electrode to include or be formed from a metal. For example, one of the following materials is suitable as the metal for one of the electrodes: aluminum, barium, indium, silver, gold, magnesium, calcium, lithium. A metallic electrode can also be permeable or transparent for electromagnetic radiation and in particular for light from the active layer. In this respect, the electrode generally has a small thickness.

Furthermore, the organic light-emitting diode generally comprises an encapsulation that protects in particular the sensitive organic layers of the organic layer stack against environmental influences. The encapsulation can be, e.g., an encapsulation layer that includes or consists of a thin-film encapsulation and a polymeric protective layer. A thin-film encapsulation can be generated using a plasma-assisted process such as an ALD (atomic layer deposition) process.

The light generated in the active layer of the OLED is either sent through the first electrode and the substrate ("bottom emitter" type) or through the second electrode and the encapsulation located thereon ("top emitter" type) or through the first electrode and the substrate and also the second electrode and the encapsulation ("transparent OLED" type).

In an OLED of the "bottom emitter" type, in particular the substrate and the first electrode arranged thereon are transparent for the radiation generated in the active layer. In addition, the substrate is flexible because the OLED is a flexible OLED. A synthetic material film is suitable, for example, as the flexible transparent substrate. The first electrode and the second electrode are generally thin such that they do not impair flexibility of the OLED.

In an OLED of the "top emitter" type, in particular the encapsulation is transparent for light generated in the active layer. Furthermore, the encapsulation is flexible because the OLED is a flexible OLED. For example, a thin-film encapsulation or a thin-film encapsulation supplemented by a polymeric protective layer is suitable as the flexible transparent encapsulation.

The OLED comprises at least one light exit surface through which the light generated in the active layer can exit the OLED. In an OLED of the "bottom emitter" type, the light exit surface is arranged on the major surface of the OLED facing the substrate while the light exit surface of an OLED of the "top emitter" type is arranged on the major surface of the OLED facing the encapsulation. A transparent OLED comprises two light exit surfaces opposite each other on the two major surfaces of the OLED.

Laterally of the light exit surfaces, the OLED generally comprises an electrical contact provided to externally electrically contact the OLED.

The flexible OLED may comprise a main extension plane. The major surfaces of the flexible OLED are arranged along the main extension plane. Due to its flexibility, the OLED deforms under mechanical loading while the flexible OLED is planar with no mechanical loading. In particular, the flexible OLED has two mutually parallel major surfaces when there is no mechanical loading, the major surfaces in particular also being oriented in parallel with the main extension plane. Under mechanical loading, the OLED bends and the main extension plane and the two major surfaces are present in a curved shape.

Furthermore, the optoelectronic device preferably comprises a first retaining element having a first major surface formed in accordance with a bent surface.

The bent surface can preferably be produced by bending a flat two-dimensional surface without having to form cuts or kinks in the surface. For example, a profile of the bent surface has an S-shape. Preferably, the bent surface is bent along at least one axis.

Furthermore, the optoelectronic device preferably comprises a second retaining element. The flexible OLED is particularly preferably arranged between the first retaining element and the second retaining element.

Preferably, the flexible OLED is mechanically fixed by the first retaining element and/or the second retaining element such that the main extension plane of the OLED is formed in accordance with the bent surface. Particularly preferably, the two major surfaces of the OLED are also formed in accordance with the bent surface.

Particularly preferably, the second element also comprises a first major surface formed in accordance with the bent surface. Particularly preferably, each major surface of the OLED is in direct contact across the whole surface with the bent surface of the first retaining element and/or the bent surface of the second retaining element.

One of our concepts is to use two retaining elements to fix a flexible OLED in a bent state. Preferably, a joining material such as, e.g., an adhesive is not used to fix the OLED in the bent state. In this manner, tensile stress on the OLED or the component parts thereof is at least reduced. Furthermore, a risk of delamination is minimized which occurs in particular in flexible OLEDs adhered to a substrate in the bent shape when the OLEDs are subjected to thermal cycles. In such OLEDs, delamination can occur either between the OLED and the substrate or even within the functional layers of the OLED.

The first retaining element and/or the second retaining element may comprise a light exit surface. If the OLED is a transparent OLED, then the two retaining elements each preferably comprise a transparent light exit surface, the light exit surfaces are preferably arranged parallel to each other and congruent with the light exit surfaces of the OLED. If only one retaining element comprises a light exit surface, then the flexible OLED is preferably arranged such that its light exit surface faces the retaining element having the light exit surface. It is also preferable for the light exit surface of the OLED to be arranged congruent with the light exit surface of the retaining element.

The first retaining element and/or the second retaining element can comprise or consist of one of the following materials: epoxy resin, polyurethane resin, polysiloxane (silicone), acrylic, polymethylmethacrylate (PMMA), metal, polycarbonate (PC), polypropylene (PP), polyimide (PI), polyethylene terephthalate (PET), wood and ceramics. The retaining elements can be produced, e.g., by additive printing methods such as for instance 3D printing and laser sintering printing methods, or by injection molding.

The OLED can be mechanically fixed to at least one of the two retaining elements by clamping. For this purpose, a groove can be provided in at least one of the retaining elements, for example. The clamping can be effected at points or even over the whole of the major surface of the retaining elements. It is also possible for the clamping to be effected in the edge region of the OLED, for example, completely around the periphery of the light exit surface of the OLED. Particularly preferably, a joining material such as, e.g., an adhesive is not used to mechanically fix the OLED in the retaining elements.

The second retaining element may be formed as a casting compound. The second retaining element can be injection-molded.

Furthermore, it is also possible for the composite consisting of the OLED and the two retaining elements to be embedded into a casting compound. Preferably, the OLED and the two retaining elements are completely surrounded by the casting compound. The OLED can be cast or injected around with the casting compound, for example. Furthermore, the casting compound can have an optical function. For example, the casting compound can be lens-shaped. Particularly preferably, the first retaining element and the second retaining element are merely temporarily stable and final stability of the optoelectronic device is achieved by the casting compound. It is hereby advantageously possible for extremely light and thin retaining elements to be used such as, e.g., bent slim injection-molding elements. In this example of the optoelectronic device, the flexible OLED, the two retaining elements and the casting compound are preferably transparent for the light from the active layer.

Particularly preferably, the first retaining element and the second retaining element connect together in a mechanically stable manner by a connecting element. For example, the two retaining elements connect together in a mechanically stable manner in their edge regions by the connecting element. Furthermore, it is also possible for a connecting element to be arranged centrally in the major surface of the OLED. Preferably, the OLED comprises an opening through which the connecting element can be inserted.

Particularly preferably, the mechanical connection between the first retaining element and the second retaining element is reversible. For example, the connecting element is selected from the following group: holding pin, dowel, clip, screw. These connecting elements generally ensure a reversible, mechanically stable connection of the two retaining elements. A reversible mechanical connection of the two retaining elements to each other has the advantage that the OLED can be replaced simply. Furthermore, the optoelectronic device is advantageously tested in the bent state after being produced and is sent, e.g., to a customer in the flat state.

Preferably, the first retaining element and the second retaining element completely surround the OLED. For example, the two retaining elements form a closed cavity around the OLED or embed the OLED. In this manner, the OLED is protected against damaging environmental influences such as, e.g., dust and dirt.

The first retaining element and/or the second retaining element may be produced from a transparent material which is transparent at least for the radiation from the active layer. At least one of the following elements can be incorporated into the transparent material: a logo, three-dimensional effects, scattering particles, luminescent particles, color filters, temperature-activated dyes, UV-activated dyes. Furthermore, it is possible for the transparent material of the retaining elements to be UV-absorbing or tinted. Scattering particles and luminescent particles may be contained in the transparent material only in a locally limited manner. Alternatively, it is also possible for scattering particles and luminescent particles to be distributed in the entire volume of the retaining element, e.g. homogeneously.

The first retaining element and/or the second retaining element may include(s) electrical contacts electrically contacting the OLED. For example, the electrical contacts can be formed as a plug connection into which the OLED can be inserted with its electrical contacts.

Furthermore, it is also possible for the OLED to comprise at least one flexible printed circuit board element guided through starting from an edge region of the OLED between the first retaining element and the second retaining element and is used to electrically contact the OLED.

The electrical contacts may protrude laterally from the retaining elements. Preferably, the electrical contacts are freely accessible from the outside. Particularly preferably, the OLED is further in direct contact with the two retaining elements in the region of the light exit surface.

The first retaining element and/or the second retaining element may comprise(s) markings for recognition by a final assembly system. The markings advantageously allow an automated final assembly system to recognize the retaining elements with the OLED and detect their spatial position. In this manner, the retaining elements are configured such that they can be easily picked up and set down by an automated final assembly system. For instance, the optoelectronic device can be easily assembled by the customer without the customer having to have much specialist knowledge.

Furthermore, the first retaining element and/or the second retaining element can be equipped with a temperature sensor, a moisture sensor, an acceleration sensor and/or a light sensor.

The optoelectronic device may include a heat paste for an improved thermal connection of the OLED to at least one of the two retaining elements. Particularly preferably, the heat-conductive paste is applied over the whole surface between the first major surface of the OLED and the first and/or second retaining element. Particularly preferably, the heat-conductive paste is applied over the whole surface in the region of the light exit surface of the OLED. The use of a heat-conductive paste advantageously results in an improved dissipation of heat from the OLED during operation of the optoelectronic device.

One retaining element may have a larger cross-sectional area than the other retaining element. In this manner, an undercut can be produced between the first retaining element and the second retaining element.

The optoelectronic device may include a further optical element such as, e.g., a lens. The optical element is preferably provided to form the radiation from the OLED in a desired manner. Furthermore, the optical element can also be a cover plate as used in a lamp for a motor vehicle.

The optoelectronic device may include further retaining elements. For example, the optoelectronic device comprises a further rod-shaped retaining element that can be inserted into the recess of the casting compound encapsulating the OLED fixed between two retaining elements. For this purpose, the recess of the casting compound preferably comprises an undercut. Furthermore, it is also possible for the further retaining element to be clipped into the cavity.

The optoelectronic device can be formed, e.g., by an arrangement that also includes a holder in which the optoelectronic device is fastened.

The first retaining element and/or the second retaining element preferably may comprise a plug connector on an outer side that can be inserted into the holder and thus produces at least one of the following connections between the optoelectronic device and the holder: a mechanical connection, an electrical connection and/or a thermally conductive connection.

Furthermore, it is also possible for the arrangement to include a plurality of optoelectronic devices fastened in the holder. In this example, particularly preferably, the holder comprises a plurality of first and second retaining elements. An OLED is preferably allocated to each pair of retaining elements which together form an optoelectronic device described herein. The arrangement preferably forms a light system.

The arrangement may include further light sources such as, e.g., a light-emitting diode, a laser, a halogen lamp or a xenon lamp.

The position of the least one optoelectronic device may be varied within the holder. Particularly preferably, the position of the first retaining element and the second retaining element can be varied relative to the holder. For example, the holder is formed as a rail along which the optoelectronic devices can be displaced.

In a method of producing an optoelectronic device, preferably initially a flexible OLED having a main extension plane is provided. Furthermore, a first retaining element having a first major surface is provided which is formed in accordance with a bent surface. The OLED is finally fixed between the first retaining element and the second retaining element such that the main extension plane of the OLED is formed in accordance with the bent surface. Particularly preferably, the first major surface and the second major surface of the OLED are formed in accordance with the bent surface.

To fix the OLED between the first retaining element and the second retaining element, the OLED can initially be inserted into the first retaining element. Then, a mold half is arranged such that a closed cavity is formed from the first retaining element and the mold half, the cavity surrounding the OLED. An injection-molding compound is injected into the closed cavity, wherein the OLED is compressed against the major surface of the first retaining element during the injection-molding process so that the main extension plane of the OLED is formed in accordance with the bent surface. Particularly preferably, the first major surface and the second major surface of the OLED are also formed in accordance with the bent surface. Finally, the injection-molding compound is hardened so that it forms the second retaining element. The finished OLED is then removed from the cavity.

The OLED with the two retaining elements may be introduced into a casting compound that completely surrounds the OLED between the retaining elements. This occurs, for example, by casting or injection molding.

In particular, the optoelectronic device described herein is suitable for use as a lamp for a motor vehicle. The lamp for the motor vehicle can be, for example, a headlamp, a taillight, a brake light, an accent lighting, a passenger compartment lighting, or a turn signal. Furthermore, it is also possible for the optoelectronic device to be used as part of a lamp for general illumination.

Features and examples described herein in conjunction with the optoelectronic device can likewise be applied to the method or the arrangement, and vice-versa. The same applies in conjunction with the lamp.

Further advantages and developments are apparent from the examples described below in conjunction with the figures.

Identical, similar elements or elements acting in an identical manner are provided with the same reference numerals in the figures. The figures and the size ratios of the elements with respect to each other, as illustrated in the figures, are not to be considered as being to scale. On the contrary, individual elements, in particular layer thicknesses, can be illustrated excessively large for improved clarity and/or for improved understanding.

Figure 1:
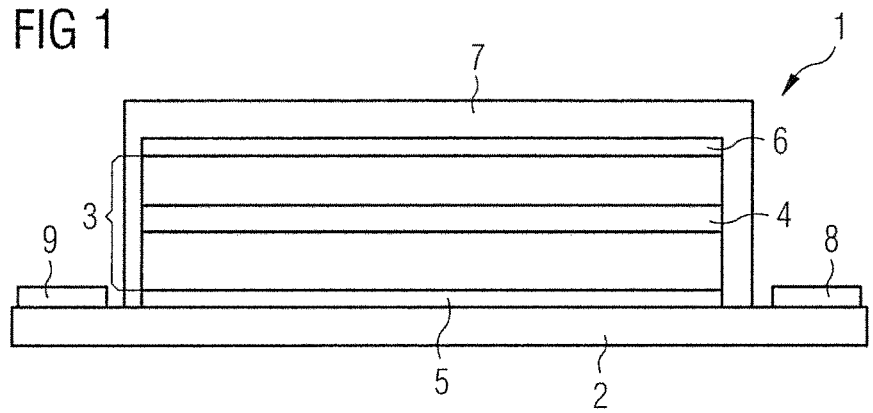
FIGS. 1 to 3 show schematic sectional illustrations of a method of producing an optoelectronic device according to one example.
Figure 2:
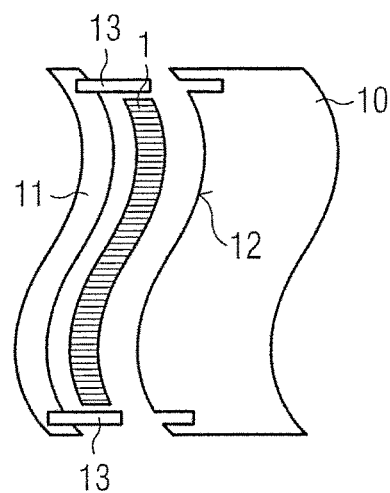
Figure 3:
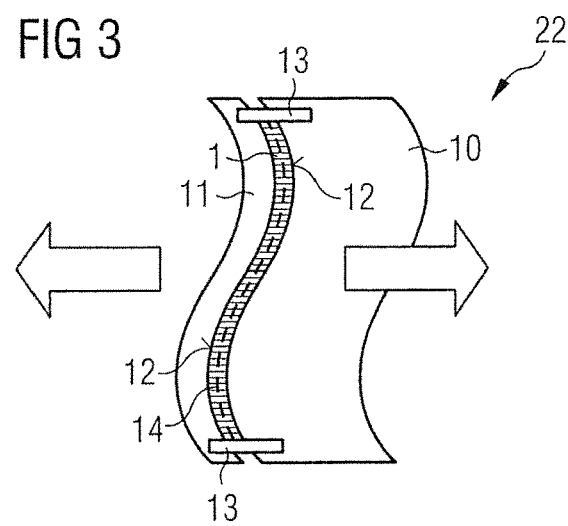

In the method according to the example in FIGS. 1 to 3, a flexible OLED 1 is initially provided (FIG. 1). The flexible OLED 1 comprises a flexible substrate 2, e.g. a synthetic material film. An organic layer stack 3 having an active radiation-generating organic layer 4 is applied within a central region of the substrate 2. The organic layer stack 3 is arranged between a first electrode 5 and a second electrode 6. Furthermore, the OLED comprises an encapsulation layer 7 that protects the organic layer stack 3 and the two electrodes 5, 6 against external influences. Preferably, the encapsulation layer 7 is a thin-film encapsulation supplemented with a polymeric protective layer. A first electrical contact 8 and a second electrical contact 9 are arranged in edge regions of the substrate 2 to electrically contact the OLED 1.

The flexible OLED 1 is arranged between a first retaining element 10 and a second retaining element 11 (FIG. 2). The first retaining element 10 has a first major surface formed in accordance with a bent surface 12. In this example, the bent surface 12 is formed such that it can be formed from a flat two-dimensional surface by bending without having to form cuts or kinks in this plane. In this example, the bent surface 12 has an S-shaped profile.

In this example, the second retaining element 11 also has a first major surface likewise formed in accordance with the bent surface 12, like the first major surface of the first retaining element 10. The second retaining element 11 has a first major surface having an S-shaped profile.

The OLED 1 is clamped in the second retaining element 11 so that it is mechanically fixed. The two retaining elements 10, 11 are then assembled together so that the OLED 1 is in direct contact, along its two major surfaces, with the first major surface of the first retaining element 10 and the first major surface of the second retaining element 11. For example, the OLED 1 is in direct contact over its two entire major surfaces with the first major surface of the first retaining element 10 and the second major surface of the second retaining element 11. Furthermore, it is also possible for the electrical contacts 8, 9 of the OLED 1 to protrude laterally from the retaining elements 10, 11 and for the OLED 1 to be in direct contact over its entire surface with the first major surface of the first retaining element 10 and the first major surface of the second retaining element 11 only in the region of the light exit surface.

A holding pin is arranged as a connecting element 13 in each of two opposite edge regions of the second retaining element 11, each holding pin being able to be introduced into a recess of the first retaining element 10 and thus producing a mechanically stable connection between the first retaining element 10 and the second retaining element 11.

FIG. 3 shows the finished optoelectronic device 22 that can be produced using the method according to FIGS. 1 to 3. The optoelectronic device 22 according to the example of FIG. 3 comprises a flexible OLED 1 arranged between a first retaining element 10 and a second retaining element 11. The first retaining element 10 and the second retaining element 11 each have a first major surface formed in accordance with a bent surface 12. In this example, the bent surface 12 has an S-shaped profile. The two retaining elements 10, 11 connect together in a mechanically stable manner via two connecting elements 13 such as a holding pin.

The OLED 1 is mechanically fixed between the first retaining element 10 and the second retaining element 11 such that a main extension plane 14 of the flexible OLED 1 is formed in accordance with the bent surface 12. The OLED 1 has at least one light exit surface within one of the two major surfaces. It is also possible for the OLED 1 to have a light exit surface on both major surfaces.

At least the retaining element 10, 11 that directly adjoins the light exit surface of the OLED 1 is formed from a transparent material, e.g., a synthetic material. In this manner, light emitted from the OLED 1 is emitted through the adjoining retaining elements 10, 11. If the OLED 1 has a light exit surface on both major surfaces, then preferably the two retaining elements 10, 11 are formed from a transparent material. If the two retaining elements 10, 11 are transparent, then the optoelectronic device 22 can emit light to both sides through the two retaining elements 10, 11 as schematically illustrated in FIG. 3 by the arrows.

Figure 4:
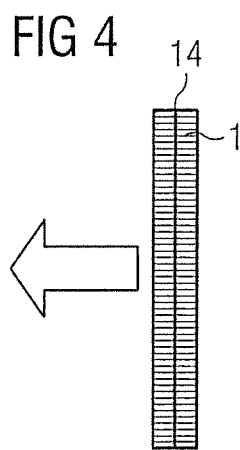
FIGS. 4 to 6 show schematic sectional illustrations of a method of producing an optoelectronic device according to a further example.
Figure 5:
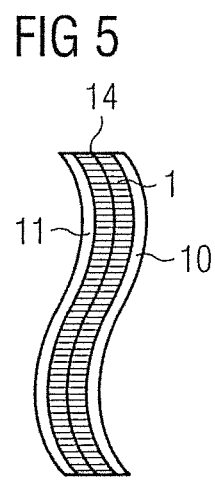
Figure 6:
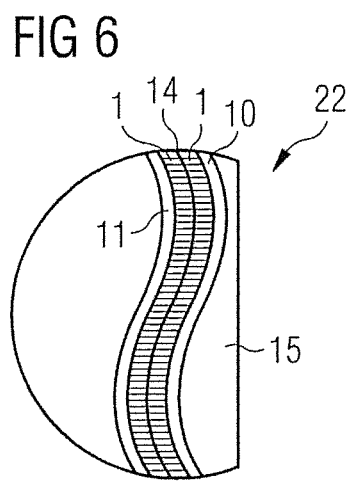

In the method according to the example in FIGS. 4 to 6, a flexible OLED 1 is again initially provided (FIG. 4). The flexible OLED 1 is introduced between two retaining elements 10, 11 that temporarily fix the OLED 1 in a curved shape (FIG. 5). To finally fix the OLED 1, the OLED 1 is introduced with the two retaining elements 10, 11 into a transparent casting compound 15 (FIG. 6). In this example, the transparent casting compound 15 is hemispherical and has an optical effect on the light emitted by the OLED 1.

Figure 7:
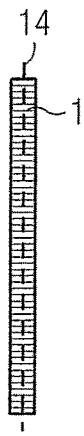
FIGS. 7 to 9 show schematic sectional illustrations of a method of producing an optoelectronic device according to a further example.
Figure 8:
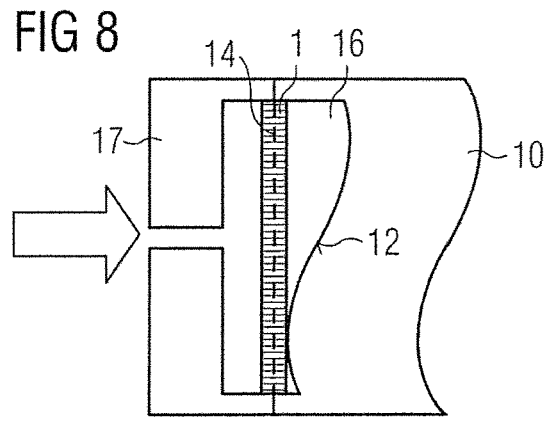
Figure 9:
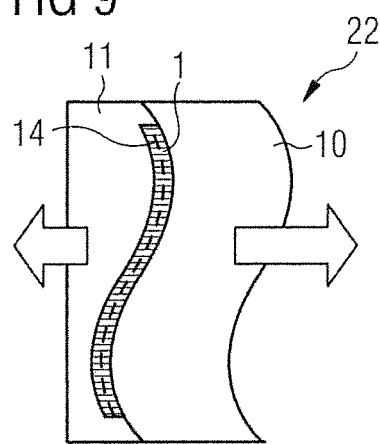

In the method according to the example in FIGS. 7 to 9, a flexible OLED 1 is again initially provided (FIG. 7). The OLED 1 is introduced into a cavity 16 formed from a first retaining element 10 and a mold half 17. Then, an injection-molding compound is injected into the cavity 16 under pressure through an injection channel in the mold half 17 as schematically illustrated by the arrow in FIG. 8. The flexible OLED 1 is pressed against the first bent major surface of the first retaining element 10 so that the OLED 1 is formed along its main extension plane 14 in accordance with the bent surface 12 of the first retaining element 10. Then, the injection-molding compound is hardened and the mold half 17 is removed.

The finished optoelectronic device 22 is schematically illustrated in FIG. 9. The optoelectronic device 22 according to FIG. 9 includes, in contrast to the optoelectronic device 22 according to FIG. 3, a second retaining element 11 formed as injection-molding part. The two retaining elements 10, 11 further have a cross-sectional area larger than the cross-sectional area of the OLED 1 so that the OLED 1 is completely surrounded by the two retaining elements 10, 11. However, the cross-sectional area of the two retaining elements 10, 11 are similar and terminate flush with one another.

Figure 10:
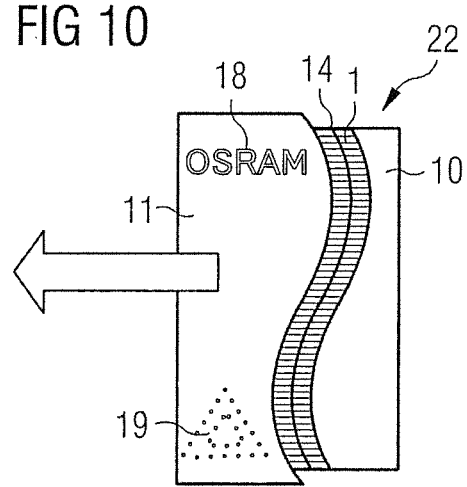

The optoelectronic device 22 according to the example in FIG. 10 comprises, in contrast to the optoelectronic devices 22 of FIGS. 3, 6 and 9, a second retaining element 11 each laterally protruding beyond the first retaining element 10. In this manner, an undercut is produced in the contour of the optoelectronic device 22. The second retaining element 11 is formed from a transparent material into which a logo 18 and, locally, a multiplicity of scattering particles 19 are incorporated.

Figure 11:
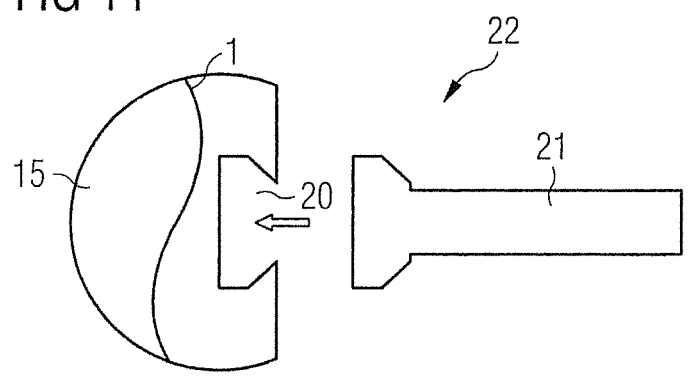

The optoelectronic device 22 according to the example in FIG. 11 includes a flexible OLED 1 fixed in a bent shape between two retaining elements (not shown) and introduced into a casting compound 15 as already described with the aid of FIG. 6. In contrast to the optoelectronic device 22 according to FIG. 6, the optoelectronic device 22 according to the example in FIG. 11 comprises a casting compound 15 with a recess 20. The recess 20 comprises an undercut in relation to the surface which terminates the hemispherical profile of the casting compound 15. Preferably, the casting compound 15 has a constant profile in the direction extending perpendicularly to the plane of the drawing.

Furthermore, the device 22 according to the example in FIG. 11 includes a third retaining element 21 inserted into the recess 20 of the casting compound 15. Particularly preferably, the third retaining element 21 has a constant profile over its entire width extending perpendicularly to the plane of the drawing. For example, the third retaining element 21 can be inserted laterally into the casting compound 15.

Figure 12:
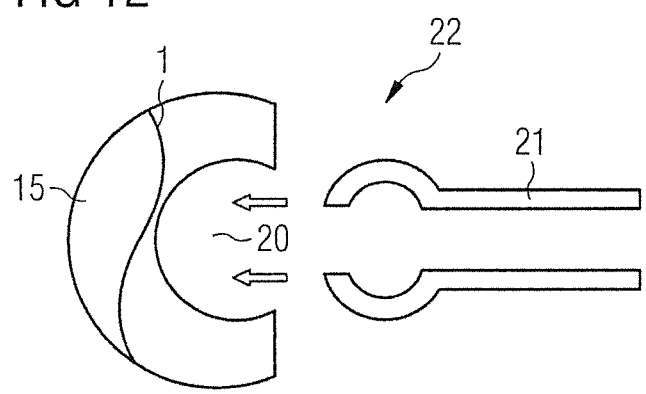

The optoelectronic device 22 according to the example in FIG. 12 comprises, like the optoelectronic device 22 in FIG. 11, a flexible OLED 1 between two retaining elements 10, 11 (not shown) which is introduced into a casting compound 15. Furthermore, the casting compound 15 has, in contrast to the example in FIG. 11, a recess 20 having a hemispherical profile. In this example, the casting compound 15 has a varying profile in the direction extending perpendicularly to the plane of the drawing. The optoelectronic device 22 according to the example in FIG. 12 also includes a third retaining element 21 clipped into the recess 20 of the casting compound 15.

The arrangement according to the example in FIG. 13 comprises two optoelectronic devices 22 as was already described, for example, with the aid of FIGS. 3, 9 and 10. The two optoelectronic devices 22 are introduced into a holder 23 which in this example is formed as a rod-shaped rail. The optoelectronic devices 22 can be displaced along the holder 23 as indicated schematically by the arrows.

This application claims priority of DE 10 2016 110 782.4, the subject matter of which is incorporated herein by reference.

The description made with reference to the examples does not restrict this disclosure to the examples. Rather, the disclosure encompasses any new feature and any combination of features, including in particular any combination of features in the appended claims, even if the feature or combination is not itself explicitly indicated in the claims or examples.

The invention claimed is:

1. An optoelectronic device comprising:
   a flexible organic light-emitting diode having a main extension plane,
   a first retaining element having a first major surface formed in accordance with a bent surface, and
   a second retaining element, wherein
   the OLED is arranged between the first retaining element and the second retaining element,
   the OLED is mechanically fixed by the first retaining element and/or the second retaining element such that the main extension plane of the OLED is formed in accordance with the bent surface.

2. The optoelectronic device according to claim 1, wherein the first retaining element and/or the second retaining element have a transparent light exit surface.

3. The optoelectronic device according to claim 1, wherein the composite consisting of the OLED and the two retaining elements is embedded in a casting compound.

4. The optoelectronic device according to claim 1, wherein the second retaining element is formed as a casting compound.

5. The optoelectronic device according to claim 1, wherein the first retaining element and the second retaining element connect together in a mechanically stable and reversible manner by a connecting element.

6. The optoelectronic device according to claim 5, wherein the connecting element is arranged in edge regions of the retaining elements.

7. The optoelectronic device according to claim 1, wherein the first retaining element and/or the second retaining element are transparent.

8. The optoelectronic device according to claim 7, wherein one of a logo, three-dimensional effects, scattering particles, luminescent particles, color filters, temperature-activated dyes and UV-activated dyes are incorporated into the transparent material.

9. The optoelectronic device according to claim 1, wherein the first retaining element and/or the second retaining element include electrical contacts that electrically contact the OLED.

10. The optoelectronic device according to claim 1, wherein the OLED comprises a flexible printed circuit board element guided through starting from an edge region of the OLED between the first retaining element and the second retaining element and electrically contacts the OLED.

11. The optoelectronic device according to claim 1, wherein the first retaining element and/or the second retaining element comprise markings for recognition by a final assembly system.

12. The optoelectronic device according to claim 1, wherein the first retaining element and/or the second retaining element are equipped with one of: temperature sensor, moisture sensor, acceleration sensor and light sensor.

13. An arrangement comprising:
at least one optoelectronic device according to claim 1, and a holder in which the optoelectronic device is fastened.

14. The arrangement according to claim 13, wherein the first retaining element and/or the second retaining element comprise a plug connector inserted into the holder and thus produces at least one mechanical connection, electrical connection or thermally conductive connection between the optoelectronic device and the holder.

15. The arrangement according to claim 13, wherein a plurality of optoelectronic devices are fastened in the holder.

16. The arrangement according to claim 13, wherein further light sources, a light-emitting diode, a laser, a halogen lamp or a xenon lamp are integrated.

17. The arrangement according to claim 13, wherein the position of the optoelectronic device can vary within the holder.

18. A method of producing an optoelectronic device, comprising:
providing a flexible OLED having a main extension plane,
providing a first retaining element having a first major surface formed in accordance with a bent surface, and
fixing the OLED between the first retaining element and a second retaining element such that the main extension plane of the OLED is formed in accordance with the bent surface.

19. The method according to claim 18, wherein fixing the OLED between the first retaining element and the second retaining element includes:
inserting the OLED into the first retaining element,
arranging a mold half such that a closed cavity is formed from the first retaining element and the mold half, said cavity surrounding the OLED,
injecting an injection-molding compound into the cavity, wherein the OLED is pressed against the first major surface of the first retaining element so that the main extension plane of the OLED is formed in accordance with the bent surface, and
hardening the injection-molding compound so that it forms the second retaining element.

20. A lamp for a motor vehicle comprising the optoelectronic device according to claim 1.

21. An optoelectronic device comprising:
a flexible organic light-emitting diode having a main extension plane,
a first retaining element having a first major surface formed in accordance with a bent surface, and
a second retaining element, wherein
the OLED is arranged between the first retaining element and the second retaining element,
the OLED is mechanically fixed by the first retaining element and/or the second retaining element such that the main extension plane of the OLED is formed in accordance with the bent surface, and
no joining material is used to mechanically fix the OLED in the retaining elements.

* * * * *